(12) United States Patent
Linder et al.

(10) Patent No.: US 6,825,697 B1
(45) Date of Patent: Nov. 30, 2004

(54) HIGH-PERFORMANCE TRACK AND HOLD CIRCUIT

(75) Inventors: Lloyd F. Linder, Agoura Hills, CA (US); Don C. Devendorf, Carlsbad, CA (US); Erick M. Hirata, Torrance, CA (US)

(73) Assignee: Telasic Communications, Inc., El Segundo, CA (US)

( * ) Notice: Subject to any disclaimer, the term of this patent is extended or adjusted under 35 U.S.C. 154(b) by 0 days.

(21) Appl. No.: 10/689,496

(22) Filed: Oct. 20, 2003

(51) Int. Cl.$^7$ .............................................. G11C 27/02
(52) U.S. Cl. ....................................... 327/94; 327/96
(58) Field of Search ........................... 327/91, 93–96; 341/122

(56) References Cited

U.S. PATENT DOCUMENTS

| | | | |
|---|---|---|---|
| 4,806,790 A | * | 2/1989 | Sone ............................ 327/94 |
| 5,004,935 A | * | 4/1991 | Murayama et al. ............ 327/94 |
| 5,315,170 A | * | 5/1994 | Vinn et al. ..................... 327/94 |
| 5,457,418 A | | 10/1995 | Chang |
| 5,583,459 A | | 12/1996 | Sone |
| 6,028,459 A | | 2/2000 | Birdsall et al. |
| 6,127,856 A | * | 10/2000 | Ueda ............................ 327/94 |
| 6,262,677 B1 | * | 7/2001 | Kiriaki et al. ............... 341/122 |

* cited by examiner

Primary Examiner—My-Trang Nuton
(74) Attorney, Agent, or Firm—Morrison & Foerster LLP

(57) ABSTRACT

A system and method for sampling and holding a signal. The invention includes a novel input circuit for a track and hold circuit comprising a circuit Q1 for receiving an input signal including an input node, a first output node N1, and a path connecting the input and output nodes; a current switching circuit for applying a first current to the node N1 during a first mode of operation but not during a second mode; and a current source for applying a second current to the node N1 during both of the first and second modes. The value of the first current is determined such that the total current in the path is constant during the first and second modes. In an illustrative embodiment, the first mode is a track mode and the second mode is a hold mode.

56 Claims, 4 Drawing Sheets

HIGH-PERFORMANCE TRACK AND HOLD CIRCUIT

BACKGROUND OF THE INVENTION

1. Field of the Invention

The present invention relates to electronics. More specifically, the present invention relates to sample and hold circuits.

2. Description of the Related Art

Sample and hold circuits (also known as track and hold circuits) are often used in analog-to-digital conversion. A sample and hold circuit (S/H) follows an analog input signal and, at predetermined intervals, holds the input voltage so that it may be converted to a digital value.

Most traditional sample and hold circuits, such as that described in U.S. Pat. No. 6,028,459, entitled "TRACK AND HOLD CIRCUIT WITH CLAMP," operate on the concept of injection of additional current at the base of the input transistor of the sampling gate as the circuit switches from track mode to hold. In track mode, the current on the input transistor is equivalent to a unity current (I). In hold mode, however, the current is effectively doubled in the input transistor as a result of the switching in of a separate, larger current source (with amplitude of 2I), resulting in a delta current of amplitude I in the input transistor. This injection of additional current (or delta current) results in an additional distortion mechanism being introduced within the signal path, and thus deterioration in the spectral purity of the track and hold output.

The effect on the degradation of the spectral purity can be addressed. As a result of the switching action, the current in the input transistor changes from 2I to I when the S/H goes from hold to track. This produces a base current step transient that must settle into the input filter thereby degrading the acquisition settling time of the gate. Additionally, the current transient in the input transistor as a result of the discharging of the transistor further degrades the acquisition settling performance. For the track-to-hold transition, the current settling response will affect the hold mode performance at the hold capacitor as a result of the finite isolation of the sampling gate in bold mode: In order to improve both the track mode and hold mode performance, the current in the input transistor should remain constant.

U.S. Pat. No. 5,457,418, entitled "TRACK AND HOLD CIRCUIT WITH AN INPUT TRANSISTOR HELD ON DURING HOLD MODE," discloses a sample and hold circuit in which the current does not double in the input transistor. However, the current is switched from one differential pair to another, creating an unwanted transient similar to that described above due to the finite delays associated with the switching times of the differential pairs.

Hence, there is a need in the art for an improved system or method for sampling and holding a signal, which reduces the current transients in the input transistor.

SUMMARY OF THE INVENTION

The need in the art is addressed by the system and method for sampling and holding a signal of the present invention. The invention includes a novel input circuit for a track and hold circuit comprising a circuit for receiving an input signal including an input node, a first output node N1, and a path connecting the input and output nodes; a current switching circuit for applying a first current to the node N1 during a first mode of operation but not during a second mode; and a current source for applying a second current to the node N1 during both of the first and second modes. The value of the first current is determined such that the total current in the path is constant during the first and second modes. In an illustrative embodiment, the first mode is a track mode and the second mode is a hold mode.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
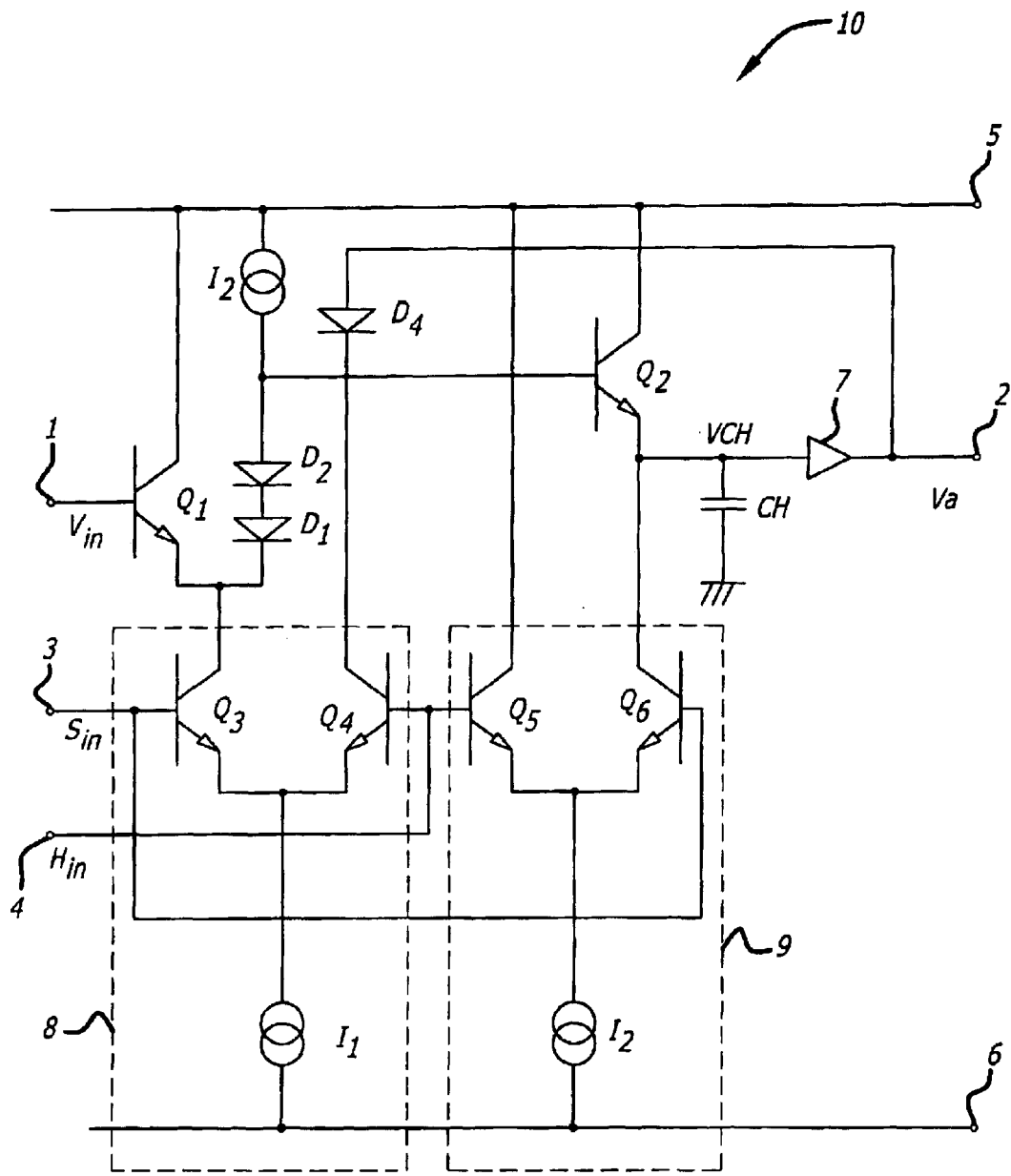
FIG. 1 is a schematic diagram of a conventional sample and hold circuit, as described in U.S. Pat. No. 5,583,459.

FIG. 1 is a schematic diagram of a conventional sample and hold circuit 10, as described in U.S. Pat. No. 5,583,459, entitled "SAMPLE HOLD CIRCUIT," the teachings of which are incorporated herein by reference. The circuit 10 includes a transistor Q1 having its base connected to an input terminal 1 and its collector connected to a high voltage supply terminal 5, a pair of series-connected diodes D1 and D2 having its cathode of the diode D1 connected to an emitter of the transistor Q1, a constant current source I2 having its one end connected to an anode of the diode D2 and its other end connected to the high voltage supply terminal 5, and a differential circuit 8 including a differential pair composed of a pair of transistors Q3 and Q4 and a constant current source I1 having its one end connected in common to emitters of the transistors Q3 and Q4 and its other end connected to a low voltage supply terminal 6. The transistor Q3 has its collector connected to the emitter of the transistor Q1 and its base connected to a sample control input terminal 3, and the transistor Q4 has its collector connected to the anode of the diode D2 and its base connected to a hold control input terminal 4.

The circuit 10 also includes a diode D4 having its cathode connected to the anode of the diode D2, a transistor Q2 having its base connected to a connection node between the diodes D2 and D4 and its collector connected to the high voltage supply terminal 5, and a differential circuit 9 including a differential pair composed of a pair of transistors Q5 and Q6 and a constant current source 13 having its one end connected in common to emitters of the transistors Q5 and Q6 and its other end connected to the low voltage supply terminal 6. The transistor Q5 has its collector connected to the high voltage supply terminal 5 and its base connected to the hold control input terminal 4, and the transistor Q6 has its collector connected to an emitter of the transistor Q2 and its base connected to the sample control input terminal 3. Furthermore, the circuit 10 includes a hold capacitor $C_H$ having its one end connected to the emitter of the transistor Q2 and its other end connected to ground, and a buffer 7 having its input connected to the hold capacitor $C_H$ and its output connected to an output terminal 2 and an anode of the diode D4.

A shortcoming of this prior art circuit is that in hold mode, the transistor Q1 shuts off so it is high impedance. This will put a settling problem into the sampling gate input network thereby degrading the overall harmonic distortion of the sampling gate.

By shutting off Q1, the input of the sampling gate becomes high impedance. This high impedance state is detrimental for several reasons. It takes time for the transistor Q1 to discharge in the off state in hold mode thereby degrading the hold mode performance of the gate. As well, for the hold-to-track transition, it takes time for Q1 to charge up and turn on, thereby degrading the acquisition settling time of the gate. An additional problem with this architecture is that Q1 and the diodes D1 and D2 are off in hold mode, creating an unpredictable capacitive divider to the base of the switch, transistor Q2, depending on the off-state impedance of these diodes and the on-resistance of diode D4 in the hold mode. This can cause unacceptably high nonlinear hold mode feed-through at the base of Q2 that will deposit on the hold cap in hold mode.

Figure 2:
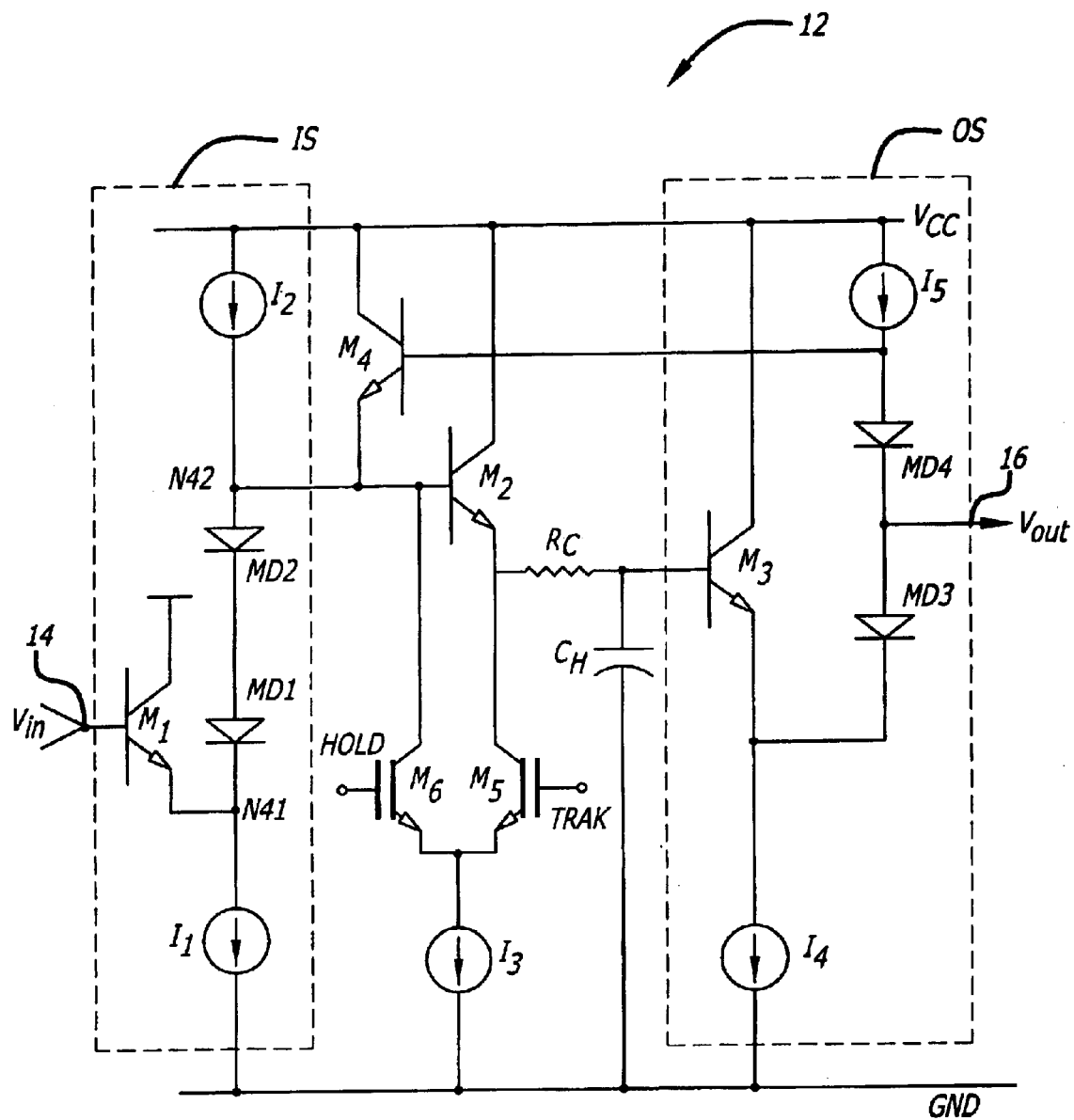
FIG. 2 is a schematic diagram of a conventional sample and hold circuit, as described in U.S. Pat. No. 6,028,459.

Other prior art has attempted to overcome these limitations by maintaining current in Q1 in hold mode. FIG. 2 is a schematic diagram of a conventional sample and hold circuit 12, as described in U.S. Pat. No. 6,028,459, the teachings of which are incorporated herein by reference. The circuit 12 includes a switching transistor M2 having a base coupled to an input circuit IS and a collector coupled to a voltage supply $V_{CC}$. The circuit 12 also includes a differential pair M5/M6 having a collector of M6 coupled to the base of switching transistor M2, and a collector of M5 coupled to the emitter of the switching transistor M2. A hold signal HOLD is applied to the base of transistor M6 and a track signal TRACK is applied to the base of transistor M5. A current source I3 is connected between the emitters of transistors M5, M6 and circuit ground. A hold capacitor $C_H$ is coupled between circuit ground and the emitter of the switching transistor M2 by means of a resistor Rc. The circuit 12 further includes a clamping transistor M4 having a collector coupled to the voltage supply $V_{CC}$, and an emitter coupled to the base of the switching transistor M2. A bias current is applied from a current source I5 to the base of the clamping transistor M4.

The circuit 12 also includes an input circuit IS including a transistor M1, a current source I1, a current source I2, and diodes MD1, MD2. The transistor M1 has a collector coupled to the voltage supply $V_{CC}$ and a base coupled to an input terminal 14 for receiving an input voltage signal Vin. A bias current is applied to the emitter of the buffer transistor M1 from current source I1. Diodes MD1, MD2 perform level shifting resulting in the dc voltage at node N42 being higher than the voltage level at node N41, which is the emitter voltage of buffer transistor M1. A bias current is applied to diodes MD1, MD2 from current source I2 which biases the diodes MD1, MD2 on. Typically, the current source I1 is approximately twice as large as current source I2, and current source I3 is approximately three times larger than current source I2.

An output circuit OS comprises a transistor M3 and diodes MD3 and MD4 which together buffer the signal held on hold capacitor $C_H$ and level shift the signal up to an output terminal 16. A bias current is applied from a current source I4 to the emitter of transistor M3. Diodes MD3 and MD4 perform level shifting to provide at the output terminal 16 a voltage $V_{OUT}$, the voltage that is held on hold capacitor $C_H$, and to provide a bias voltage for transistor M4 when in the hold mode. A bias current is applied to diodes MD3, MD4 from the current source I5 to bias these diodes MD3, MD4 on.

The S/H circuit 12 of FIG. 2 does not shut the input transistor M1 off in hold mode. For this architecture, there is always a steady state current. However, the current in M1 changes from track to hold modes. During track, M1's emitter current is I, but during hold, the emitter current is 2I. This is because I1 distributes between M1 and MD1 and MD2 in track mode and is only in M1 in hold mode. Resultantly, the base current in M1 experiences a transient step for the hold-to-track and track-to-hold transitions. This transient settling will degrade the acquisition settling and hold mode settling of the gate. The reason for this is the transitions produce an impulse of base current at the input of M1 and this impulse must settle into the impedance seen at the base of M1. If the impedance is that of a narrowband filter, the settling time of this error will be very long.

Figure 3:
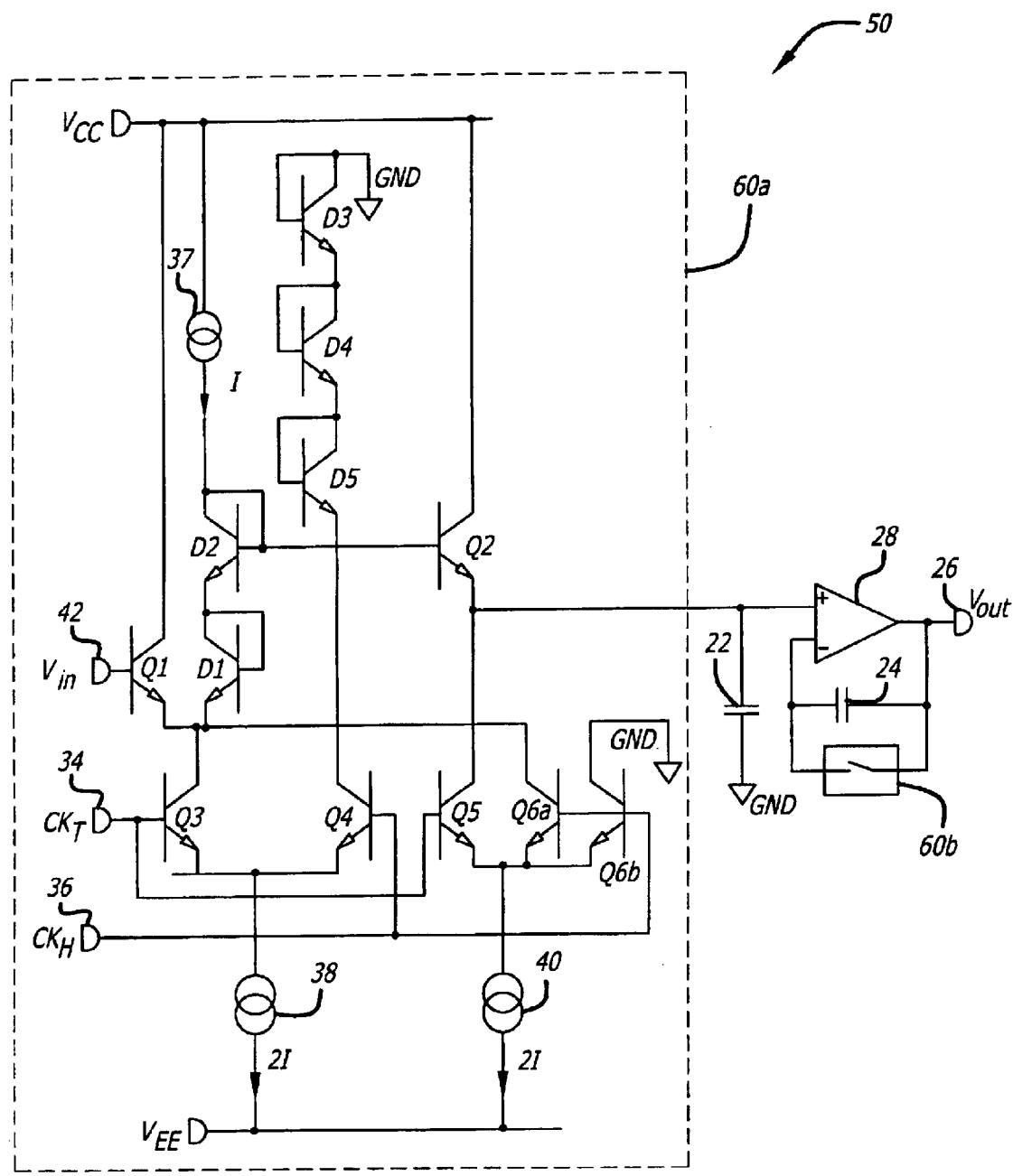
FIG. 3 is a schematic diagram of a conventional sample and hold circuit, as described in U.S. Pat. No. 5,457,418.

FIG. 3 is a schematic diagram of a conventional sample and hold circuit 50, as described in U.S. Pat. No. 5,457,418, the teachings of which are incorporated herein by reference. The circuit 50 includes a switching device 60a comprising a transistor Q1 having its base connected to an input terminal 42 and its collector connected to a high voltage supply $V_{CC}$, a pair of series-connected diodes D1 and D2 having the cathode of the diode D1 connected to an emitter of the transistor Q1, a constant current source 37 having its one end connected to an anode of the diode D2 and its other end connected to the voltage supply $V_{CC}$, and a differential circuit including a differential pair Q3, Q4 and a constant current source 38 having its one end connected in common to the emitters of the transistors Q3 and Q4 and its other end connected to a low voltage supply $V_{EE}$. The transistor Q3 has its collector connected to the emitter of the transistor Q1 and its base connected to a sample control input terminal 34, and the transistor Q4 has its collector connected to the anode of the diode D2 and its base connected to a hold control input terminal 36.

The switching device 60a also includes series-connected diodes D3, D4, and D5 having the cathode of D5 connected to the anode of the diode D2 and the anode of D3 connected to ground, a transistor Q2 having its base connected to a connection node for diodes D2 and D5 and its collector connected to $V_{CC}$, and three transistors Q5, Q6a, and Q6b having emitters connected in common to a constant current source 40, the other end of the current source 40 being connected to $V_{EE}$. The transistor Q5 has its collector connected to the emitter of Q2 and its base connected to the sample control input terminal 34, the transistor Q6a has its collector connected to the emitter of Q1 and its base connected to the hold control input terminal 36, and the transistor Q6b has its collector connected to ground and its base connected to the hold control input terminal 36.

The circuit 50 also includes a hold capacitor 22 having its one end connected to the emitter of the transistor Q2 and its other end connected to ground. The voltage on the capacitor 22 is provided to output terminal 26 via a buffer 28. A switch 60b and capacitor 24 are connected in parallel to a negative terminal of the buffer 28 and the output terminal 26.

A disadvantage of this circuit 50 is that the transistor D2 is referenced off of the input signal. This allows the clamp transistor D2 to be bootstrapped with respect to the signal during the track mode, thereby improving the track mode distortion. The clamp circuit (D3, D4, D5) is referenced to a hard voltage, independent of the input signal, and thus creates amplitude-dependent distortion in track mode.

In the S/H circuit 50 of FIG. 3, an attempt is made to keep the current in the input transistor Q1 constant in track and hold modes. Q3 supplies 2I in track mode, which gets split between Q1, and D1 and D2. In hold mode, the current is 0 in D1 and D2, and the current I is provided to Q1 by Q6a. The problem with this approach is the time it takes the transistors in the switch pairs to turn on and off is finite, and during these transitions, the current in Q1 will be zero, as a result of the finite time it takes for the current to be supplied from Q6a instead of Q3 and vice versa. Ultimately, if the current in Q1 could remain fixed in track and hold modes and during the transitions, this would minimize the base current glitch at the input as well as maintain constant current in Q1 during all transitions. This would help the sampled mode performance of the sampling gate. This is the improvement that the invention presented here provides.

Figure 4:
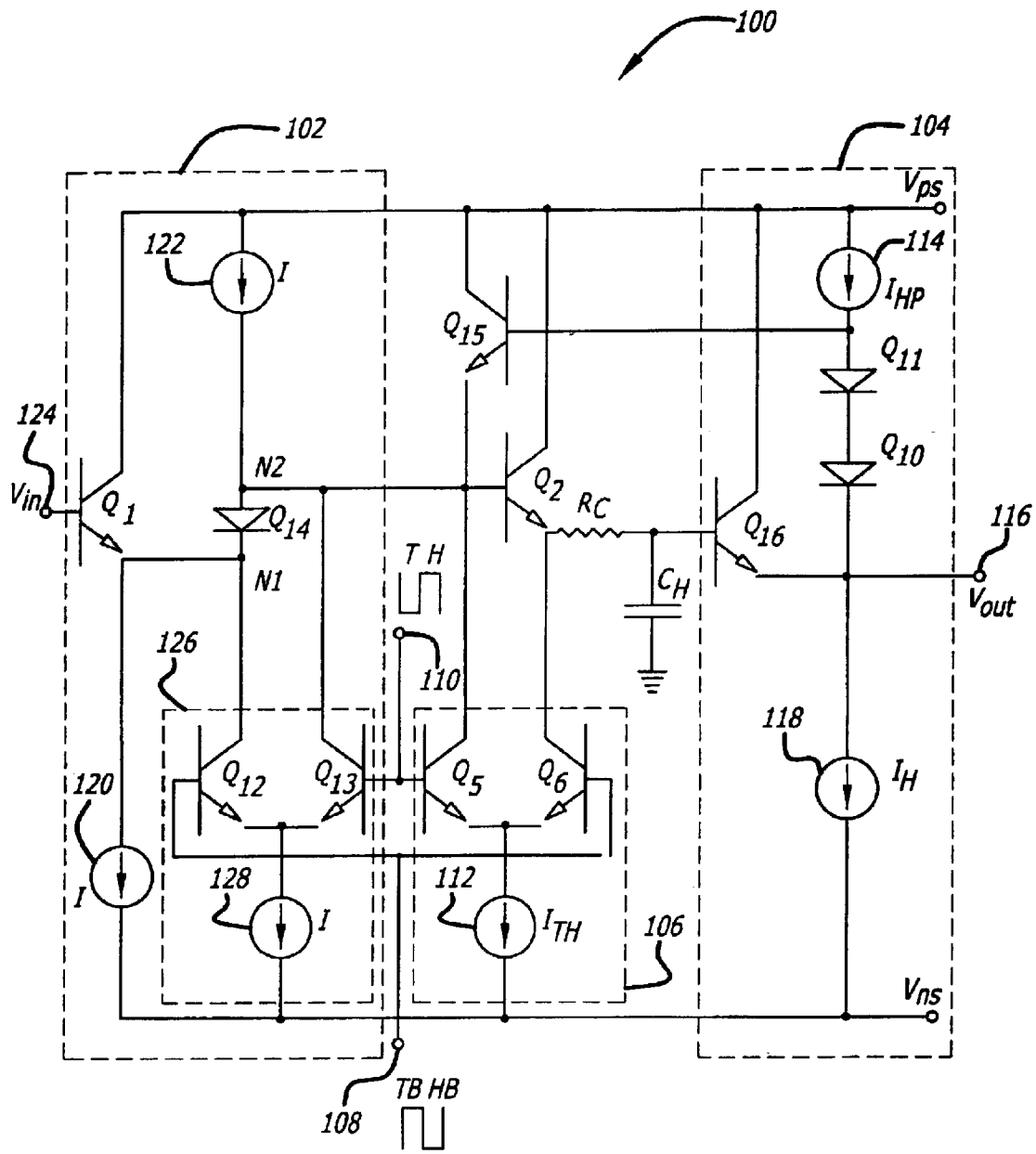
FIG. 4 is a diagram of a sample and hold circuit designed in accordance with an illustrative embodiment of the present invention.

FIG. 4 is a diagram of a sample and hold circuit 100 designed in accordance with an illustrative embodiment of the present invention. The circuit 100 includes a switching circuit Q2 that couples to an input circuit 102 for receiving an input signal Vin and couples to an output circuit 104 for supplying an output signal Vout. It will be appreciated that although the sample and hold circuit 100 is illustrated as a single-ended circuit, it can also be configured as a differential circuit with two S/H circuits 100 to process differential signals. In addition, it will be appreciated that although the S/H circuit 100 is illustrated as comprising npn bipolar transistors, other transistors such as pnp, complementary metal oxide semiconductor (CMOS), n-channel metal oxide semiconductor (NMOS) or p-channel metal oxide semiconductor (PMOS) may be used without departing from the scope of the present teachings.

The novel S/H circuit 100 includes a switching transistor Q2 having a base coupled to an input circuit 102 at a node N2 and a collector coupled to a high voltage supply Vps. The circuit 100 also includes a differential amplifier 106 comprised of a pair of transistors Q5 and Q6 having a collector of Q5 coupled to the base of switching transistor Q2, and a collector of Q6 coupled to the emitter of the switching transistor Q2. A track signal TBHB from a track signal terminal 108 is applied to the base of transistor Q6 and a hold signal TH from a hold signal terminal 110 is applied to the base of transistor Q5. A current source 112 of value $I_{TH}$ is connected between the emitters of transistors Q5, Q6 and a low voltage supply Vns.

A hold capacitor $C_H$ is coupled between circuit ground and the emitter of the switching transistor Q2 by means of a resistor Rc. The resistor Rc is used to optimize noise and distortions. The circuit 100 further includes a clamping transistor Q15 having a collector coupled to the voltage supply Vps, and an emitter coupled to the base of the switching transistor Q2. A bias current $I_{HP}$ is applied from a current source 114 to the base of the clamping transistor Q15.

The output circuit 104 buffers the signal held on the hold capacitor $C_H$ and outputs the signal at an output terminal 116. In the illustrative embodiment, the output circuit 104 comprises a transistor Q16 and diodes Q10 and Q11. Since the hold capacitor $C_H$ has a relatively high input impedance, the transistor Q16 operates as a hold amplifier to buffer the voltage stored on the hold capacitor $C_H$. A bias current $I_H$ is applied from a current source 118 to the emitter of transistor Q16 to bias the hold amplifier on. The voltage $V_{OUT}$ at the emitter of transistor Q16 is output at the output terminal 116. The diodes Q10 and Q11 perform level shifting to provide a bias voltage for transistor Q15 when in the hold mode. A bias current $I_{HP}$ is applied to the diodes Q10 and Q11 from current source 114 to bias these diodes Q10 and Q11 on.

The input circuit 102 includes an input transistor Q1, current sources 120 and 122, and a diode Q14. Transistor Q1 operates as a buffer transistor and has a collector coupled to Vps and a base coupled to an input terminal 124 for receiving an input voltage signal Vin. A bias current I is applied to the emitter of buffer transistor Q1 from a current source 120. The cathode of the diode Q14 is connected to the emitter of transistor Q1, and the current source 122 has one end connected to the anode of the diode Q14 and the other end connected to Vps. The diode Q14 performs level shifting resulting in the dc voltage at node N2, between the diode Q14 and the current source 122, being higher than the voltage level at node N1, which is the emitter voltage of the buffer transistor Q1. A bias current of value I is applied to diode Q14 from the current source 122 which biases the diode Q14 on.

In accordance with the teachings of the present invention, the input circuit 102 further includes a current switching circuit 126 comprising a differential pair of transistors Q12 and Q13, and a current source 128 having its one end connected in common to the emitters of the transistors Q12 and Q13 and its other end connected to Vns. The transistor Q12 has its collector connected to the cathode of diode Q14 at node N1 and its base connected to the track signal terminal 108, and the transistor Q13 has its collector connected to the anode of the diode Q14 at node N2 and its base connected to the hold signal terminal 110. The current source 128 outputs the same current as the current source 122. In the illustrative embodiment, the current sources 120, 122, and 128 all output the same current I.

The S/H circuit 100 operates in a track mode and a hold mode. The track signal and the hold signal are complementary so transistors Q12 and Q13 alternately conduct. When the circuit 100 is in track mode, Q1 has current I, Q12 has current I, Q13 has current 0, Q14 has current I, and Q15 has current 0. In hold mode, Q1 has current I, Q12 has current 0, Q13 has current I, Q14 has current 0, and Q15 has current $I_{TH}$. The end result is that by adding the additional differential pair Q12 and Q13 in the manner described, the emitter current of Q1 stays constant whether the device is in track or hold mode.

The difference between the S/H circuit 100 of the present invention and the conventional S/H circuit 12 shown in FIG. 2 is the insertion of the differential pair Q12 and Q13, which allows for the reduction in overall current transients by reducing the delta current in Q1 to zero and avoiding the transient behavior of the prior art circuit 50 of FIG. 3. This additional differential pair allows for the splitting of the overall DC current source into two sub-components, each with equal magnitude I. When Q12 is in track mode, it supplies transistor Q14 with a total emitter current of I as in the traditional circuit. When Q12 is turned off, the circuit is then switched to hold mode, however the splitting of current allows for the maintenance of constant emitter current on Q1, thus reducing the injection of additional transients in the input signal path.

The function of the differential pair consisting of Q12 and Q13 is to switch the current in the diode Q14. By acting as a differential pair for the current switch in Q14, the current in Q1 remains fairly constant during all transitions, thereby reducing the transient at the input network of Q1 since transients in Q14's emitter current should be somewhat independent of the current in Q1 and these current transients should be reduced when they are referenced to the input. By keeping the input current fairly constant over time, this reduces any excitations at the input network of the sampling gate, thereby guaranteeing improved acquisition and hold mode settling over the prior art.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A circuit comprising:
   an input circuit for receiving an input signal, said input circuit including an input node, a first output node N1, and a path connecting said input and output nodes;
   first means for applying a first current to said node N1 during a first mode of operation but not during a second mode; and
   second means for applying a second current to said node N1 during both of said first and second modes.

2. The invention of claim 1 wherein the value of said first current is determined such that the total current in said path is constant during said first and second modes.

3. The invention of claim 1 wherein said circuit further includes third means for level shifting said input signal at said node N1 to a second output node N2.

4. The invention of claim 3 wherein said first current is equal to a current drawn by said third means at said node N1 during said first mode.

5. The invention of claim 3 wherein said first means includes a current switching circuit.

6. The invention of claim 5 wherein said current switching circuit is configured to receive a first signal and in accordance therewith apply said first current to said node N1.

7. The invention of claim 6 wherein said current switching circuit is also configured to receive a second signal and in accordance therewith apply said first current to said second node N2.

8. The invention of claim 7 wherein said first signal is complementary to said second signal.

9. The invention of claim 8 wherein said current switching circuit includes a differential pair of transistors Q12 and Q13.

10. The invention of claim 9 wherein the emitters of said transistors Q12 and Q13 are connected in common to a first end of a first current source.

11. The invention of claim 10 wherein a second end of said first current source is connected to a low voltage supply Vns.

12. The invention of claim 11 wherein a collector of transistor Q12 is connected to said first node N1.

13. The invention of claim 12 wherein a collector of transistor Q13 is connected to said second node N2.

14. The invention of claim 13 wherein a base of transistor Q12 is connected to said first signal.

15. The invention of claim 14 wherein a base of transistor Q13 is connected to said second signal.

16. The invention of claim 1 wherein said second means includes a second current source.

17. The invention of claim 16 wherein a first end of said second current source is coupled to said first node N1.

18. The invention of claim 17 wherein a second end of said second current source is connected to a low voltage supply Vns.

19. The invention of claim 3 wherein said third means includes a diode Q14.

20. The invention of claim 19 wherein a cathode of said diode Q14 is connected to said first node N1.

21. The invention of claim 20 wherein an anode of said diode Q14 is connected to said second node N2.

22. The invention of claim 19 wherein said third means further includes a third current source having a first end coupled to said second node N2 for applying a bias current to said diode Q14.

23. The invention of claim 22 wherein a second end of said third current source is coupled to a high voltage supply Vps.

24. The invention of claim 22 wherein said first current is equal to said bias current.

25. The invention of claim 22 wherein said second current is equal to said bias current.

26. The invention of claim 1 wherein said first current is equal to said second current.

27. The invention of claim 1 wherein said input circuit includes a transistor Q1.

28. The invention of claim 27 wherein a base of said transistor Q1 is adapted to receive said input signal.

29. The invention of claim 27 wherein an emitter of said transistor Q1 is connected to said first node N1.

30. The invention of claim 27 wherein a collector of said transistor Q1 is connected to a high voltage supply Vps.

31. The invention of claim 1 wherein said first mode is a track mode.

32. The invention of claim 1 wherein said second mode is a hold mode.

33. A circuit comprising:
   an input circuit for receiving an input signal, said input circuit including an input node, a first output node N1, and a path connecting said input and output nodes;
   a level shifting circuit for level shifting said input signal at said node N1 to a second node N2;
   a current switching circuit configured to receive a track signal and in accordance therewith apply a first current from a first current source to said node N1 during a track mode, and configured to receive a hold signal and in accordance therewith apply said first current to said node N2 during a hold mode; and
   a second current source for applying a second current to said node N1 during both of said track and hold modes.

34. The invention of claim 33 wherein the value of said first current is determined such that the total current in said path is constant during said track and hold modes.

35. The invention of claim 33 wherein said first current is equal to a current drawn by said level shifting circuit at said node N1 during said track mode.

36. The invention of claim 33 wherein said current switching circuit includes a differential pair of transistors Q12 and Q13 having emitters connected in common to said first current source.

37. The invention of claim 36 wherein a collector of transistor Q12 is connected to said node N1 and a collector of transistor Q13 is connected to said node N2.

38. The invention of claim 37 wherein a base of transistor Q12 is connected to said track signal and a base of transistor Q13 is connected to said hold signal.

39. The invention of claim 33 wherein said level shifting circuit includes a diode Q14, wherein a cathode of said diode Q14 is connected to said node N1 and an anode of said diode Q14 is connected to said second node N2.

40. The invention of claim 39 wherein said level shifting circuit further includes a third current source for applying a bias current to said diode Q14.

41. The invention of claim 33 wherein said input circuit includes a transistor Q1 having a base adapted to receive said input signal and an emitter connected to said node N1.

42. A track and hold circuit comprising:
an input circuit for conveying an input signal, wherein said input circuit comprises:
an input buffer circuit for receiving said input signal, said input buffer circuit including an input node, a first output node N1, and a path connecting said input and output nodes;
a level shifting circuit for level shifting said input signal at said node N1 to a second node N2;
a current switching circuit configured to receive a track signal and in accordance therewith apply a first current from a first current source to said node N1 during a track mode, and configured to receive a hold signal and in accordance therewith apply said first current to said node N2 during a hold mode; and
a second current source for applying a second current to said node N1 during both of said track and hold modes;
a capacitor circuit for storing a voltage representative of said input signal;
a differential amplifier circuit configured to receive said track signal and in accordance therewith generate a first control signal, and configured to receive said hold signal and in accordance therewith generate a second control signal; and
a switching circuit coupled between said input circuit and said capacitor circuit and configured to receive said first and second control signals and in accordance therewith close and open.

43. The invention of claim 42 wherein said track and hold circuit further includes an output circuit coupled to the capacitor circuit and configured to receive a voltage appearing across the capacitor and in accordance therewith generate an output signal.

44. The invention of claim 42 wherein said track and hold circuit further includes a clamping circuit coupled to said switching circuit and adapted to receive said second control signal and in accordance therewith clamp the voltage on the switching circuit to isolate the input signal from the voltage representative of the input signal stored on the capacitor circuit.

45. The invention of claim 42 wherein the value of said first current is determined such that the total current in said path is constant during said track and hold modes.

46. The invention of claim 42 wherein said first current is equal to a current drawn by said level shifting circuit at said node N1 during said track mode.

47. The invention of claim 42 wherein said current switching circuit includes a differential pair of transistors Q12 and Q13 having emitters connected in common to said first current source.

48. The invention of claim 47 wherein a collector of transistor Q12 is connected to said node N1 and a collector of transistor Q13 is connected to said node N2.

49. The invention of claim 48 wherein a base of transistor Q12 is connected to said track signal and a base of transistor Q13 is connected to said hold signal.

50. The invention of claim 42 wherein said level shifting circuit includes a diode Q14, wherein a cathode of said diode Q14 is connected to said node N1 and an anode of said diode Q14 is connected to said second node N2.

51. The invention of claim 50 wherein said level shifting circuit further includes a third current source for applying a bias current to said diode Q14.

52. The invention of claim 51 wherein said first current is equal to said bias current.

53. The invention of claim 51 wherein said second current is equal to said bias current.

54. The invention of claim 42 wherein said first current is equal to said second current.

55. The invention of claim 42 wherein said input buffer circuit includes a transistor Q1 having a base adapted to receive said input signal and an emitter connected to said node N1.

56. A method for reducing current transients in a track and hold circuit including the steps of:
receiving an input signal in an input circuit including an input node, an output node N1, and a path connecting said input and output nodes;
applying a first current to said node N1 during both a track mode and a hold mode; and
applying a second current to said node N1 during said track mode but not during said hold mode, such that the total current in said path remains constant during both track and hold modes.

* * * * *